United States Patent [19]

Atherton et al.

[11] Patent Number: 5,315,235
[45] Date of Patent: May 24, 1994

[54] ELECTRICAL ENERGY METER WITH PROGRAMMABLE REGISTER COMPONENT

[75] Inventors: Kenneth W. Atherton, Saco, Me.; Susan D. Dastous, Milford, N.H.; Kevin P. Grogan, South Berwick, Me.; Gregory P. Lavoie, Newmarket, N.H.; Marjorie J. Mancuso, Exeter, N.H.; Mark J. Plis, Barrington, N.H.

[73] Assignee: General Electric Company, Schenectady, N.Y.

[21] Appl. No.: 6,600

[22] Filed: Jan. 21, 1993

Related U.S. Application Data

[63] Continuation of Ser. No. 764,863, Sep. 24, 1991, abandoned.

[51] Int. Cl.$^5$ .................. G01R 19/16; G06F 15/20
[52] U.S. Cl. ......................... 324/116; 324/103 R; 324/142; 364/482
[58] Field of Search .............. 324/103 R, 116, 142, 324/140 R, 141; 340/870.02; 364/483, 492

[56] References Cited

U.S. PATENT DOCUMENTS

| | | | |
|---|---|---|---|
| 4,197,582 | 4/1980 | Johnston et al. | 324/162 |
| 4,283,772 | 8/1981 | Johnston | 324/103 R |
| 4,556,843 | 12/1985 | Milkovic et al. | 324/142 |
| 4,571,692 | 2/1986 | Germer | 324/103 R |
| 4,620,150 | 10/1986 | Germer et al. | 324/103 R |
| 4,663,587 | 5/1987 | Mackenzie | 324/142 |
| 4,884,021 | 11/1989 | Hammond et al. | 324/141 |
| 4,999,576 | 3/1991 | Levinson | 324/142 |
| 5,014,213 | 5/1991 | Edwards et al. | 324/116 |
| 5,059,896 | 10/1991 | Germer et al. | 324/142 |
| 5,146,157 | 9/1982 | Clarke et al. | 324/141 |
| 5,194,850 | 3/1993 | Bourrierer et al. | 324/142 |
| 5,229,713 | 7/1993 | Bullock et al. | 324/142 |

FOREIGN PATENT DOCUMENTS

| | | |
|---|---|---|
| 1938728 | 2/1971 | Fed. Rep. of Germany . |
| 1939165 | 5/1971 | Fed. Rep. of Germany . |
| 2630959 | 1/1978 | Fed. Rep. of Germany . |
| 2944660 | 2/1981 | Fed. Rep. of Germany . |

OTHER PUBLICATIONS

Real Time Software for Small Systems, A. W. Leigh, 1988, pp. 59–81.
Sangamo Energy Management Division, Product Bulletin 10506, ST-Q100 Series, Electronic Meter, Effective Date Jun. 1987.
Sangamo Energy Management Division, Product Bulletin 10251, ST-Q120 Series, Electronic Meter, Effective Date Aug., 1987.
Sangamo Electricity Division, KV1 Multifunction Meter, Product Bulletin 10532, Effective Sep., 1989.
Scientific Columbus, JEM3, Sep. 1989.
Appalachian Technologies Corporation, SSM-SOT Four Quadrant, Time-of-Use Precision Meter, Oct. 1989.
APTECH, Inc., PFM-800 Series Multifunction Meters, Jan. 91.
Process Systems Incorporated, The Quad 4 Solid State Meter Family, May 1991.
Trans Data, EMS 7000 Electronic Metering Sustem with Demand Register, Publication Data Unknown, this copy obtained on May 14, 1991.
ABB Type E1R Polyphase Solid-State Watthour/Varhour Meter, Sep. 1991.
Schlumberger Industries, Inc. Introducing FULCRUM Commercial/Industrial Meters, Mar. 1991.
Transmission & Distribution, May 1992, Universal Meter Introduced by ABB . . .
Engineering Presentation To AEIC/EEI Meter and Service Committees, Sep. 24, 1990, pp. 1–6.

*Primary Examiner*—Vinh Nguyen
*Attorney, Agent, or Firm*—Bell, Seltzer, Park & Gibson

[57] ABSTRACT

An energy meter capable of converting from one mode of operation to another mode of operation is described. In the one embodiment, the present apparatus measures energy consumption, and converts operation from a first mode to a second mode.

9 Claims, 4 Drawing Sheets

Fig-4

| TABLE | ENTRY | BYTE | VALUE |
|---|---|---|---|
| TASKTBL | 0 | 0 | MEMORY PAGE FOR MODE INITALIZATION TASK |
|  | 0 | 1 | ADDRESS FOR MODE INITALIZATION TASK |
|  | 1 | 3 | MEMORY PAGE FOR TASK 1 |
|  | 1 | 4 | ADDRESS FOR TASK 1 |
|  |  |  |  |
|  |  |  |  |
|  |  |  |  |
|  | n | 3n | MEMORY PAGE FOR TASK n |
|  | n | 3n+ | ADDRESS FOR TASK n |
|  | n+1 | 3n+3 | UNUSED |
|  | n+1 | 3n+4 | SENTINEL VALUE (0) |

302

300

| TABLE | ENTRY | BYTE | VALUE |
|---|---|---|---|
| MODETBL | 0 | 0 | MEMORY PAGE FOR TASK TABLE 1 |
|  | 0 | 1 | ADDRESS FOR TASK TABLE 1 |
|  | 1 | 3 | MEMORY PAGE FOR TASK TABLE 2 |
|  | 1 | 4 | ADDRESS FOR TASK TABLE 2 |
|  |  |  |  |
|  |  |  |  |
|  |  |  |  |
|  | i | 3i | MEMORY PAGE FOR TASK TABLE i |
|  | i | 3i+1 | ADDRESS FOR TASK TABLE i |
|  | i+1 | 3i+3 | UNUSED |
|  | i+1 | 3i+4 | SENTINEL VALUE (0) |

304

| TABLE | ENTRY | BYTE | VALUE |
|---|---|---|---|
| TASKTBL | 0 | 0 | MEMORY PAGE FOR MODE INITALIZATION TASK |
|  | 0 | 1 | ADDRESS FOR MODE INITIALIZATION TASK |
|  | 1 | 3 | MEMORY PAGE FOR TASK 1 |
|  | 1 | 4 | ADDRESS FOR TASK 1 |
|  |  |  |  |
|  |  |  |  |
|  |  |  |  |
|  | n | 3n | MEMORY PAGE FOR TASK n |
|  | n | 3n+1 | ADDRESS FOR TASK n |
|  | n+1 | 3n+3 | UNUSED |
|  | n+1 | 3n+4 | SENTINEL VALUE (0) |

ELECTRICAL ENERGY METER WITH PROGRAMMABLE REGISTER COMPONENT

This application is a continuation of application Ser. No. 07/764,863, filed Sep. 24, 1991, now abandoned.

A portion of the disclosure of this patent document contains material which is subject to copyright protection. The copyright owner has no objection to the facsimile reproduction by anyone of the patent document or the patent disclosure, as it appears in the Patent and Trademark Office patent file or records, but otherwise reserves all copyright rights whatsoever.

I. BACKGROUND OF THE INVENTION

A. Field of the Invention

The present invention generally relates to energy meters, and more specifically, relates to energy meters having the flexibility to perform various types of metering functions.

B. Related Art

In the art of energy metering, those skilled in the art typically view a meter as being composed of two (2) basic components—a metering component and a register component. The metering component is coupled to a power distribution network and generates signals indicative of power consumption. These signals are passed to the register component which performs such functions as storing the signals in a time-of-use format or a demand-type format.

Once a month or so, a meter reader is dispatched to "read" the meter. In some cases, reading a meter may simply involve downloading the register component memory into a portable electronic memory storage device carried by the meter reader.

Recently, meter manufacturers have begun manufacturing the metering component and register component in fully solid state form. This transition is due, at least in part, to the desire of power utility companies to have energy meters with the flexibility to perform a wide array of functions. Such flexibility can only be provided using solid state technology.

One significant and potential cost-saving feature made possible with the transition to solid state technology is to provide "convertible" meters. This means that the register component can be converted from performing, for example, demand-only functions to demand and time-of-use functions. The register component, therefore, is convertible from one function to other functions.

Until now, however, such convertibility was only provided by removing the register component and substituting another register component capable of performing the desired function. For example, a demand-only register component would be removed from the meter and replaced with a demand and time-of-use register component. Rather than being "convertible", these register components actually are "replaceable" modules. An example of a modular register component is set forth in U.S. Pat. No. 5,014,213.

It is desirable, therefore, to provide a truly convertible register which does not require removing and replacing one register component for another in order to change register function.

II. SUMMARY OF THE INVENTION

The present invention, in one embodiment, is an operating system utilized in register component applications. The operating system coordinates the task execution sequence and priority of major tasks to be executed by the register component. The operating system, in the one embodiment, is table driven. The tables are a form of indirect addressing to respective software routines which control operation of the register component to perform respective tasks in a predetermined order.

The tables are executed from RAM, and may point to software routines stored in either ROM or RAM. More particularly, the task tables are composed of pointers to modules which perform respective tasks such as keeping track of timers and counters for "time and date" information. By changing the operation mode of the operating system, a different set of tasks are executed.

In the normal execution mode, the operating system executes an infinite loop, i.e., unless an interrupt or "new priority" flag is set, the operating system continues to execute through the loop. This loop is sometimes referred to herein as the "kernel" loop. At the beginning of the kernel loop, a MODE byte is read to index an entry in a MODE TABLE. Each of the entries in the MODE TABLE is a pointer to a task table entry. Each entry in the task table is a pointer to a software routine.

The operating system causes the first task of the selected task table to be executed, then checks whether there is any request for an immediate mode change. As long as there is no request for an immediate mode change, the tasks of the selected task table are executed in sequence as defined in the selected task table and until the end of the selected task table is reached, i.e., until the last task in the selected task table is executed. When the end of the selected task table is reached, or if an immediate mode change is requested, the operating system re-loads the value of the MODE byte and re-indexes the MODE TABLE. The newly selected task table is then executed.

If no mode change has been requested, either immediate or regular, then the task table "pointed to" will be the same task table just executed. An important point to note is that when a mode change occurs, task 0 of the selected task table is the first task executed. If no mode change has occurred, and the task table just executed is again selected, task 1 of the task table is the first task executed.

Task 0 of each task table is referred to as the mode initialization task and provides a place where routines may be located which only need to be executed once per mode, rather than once per task table cycle during the mode. If there are no routines in a mode that have this requirement, the mode initialization task simply returns control to the operating system, which then continues execution of the task table beginning with task 1.

In the one embodiment, to convert a register component having the present operating system from a Demand-Only register to a Time-of-Use and Demand register, for example, task tables are loaded into the register component and a different mode is selected. The additional task tables are utilized for performing necessary time-of-use functions. By selecting an appropriate mode, the execution sequence of task tables is changed so that the appropriate task tables are executed.

The present invention, importantly, provides that a register component can be changed from a demand-only register to a time-of-use and demand register without requiring that the register component be removed and replaced. The present invention facilitates providing a truly convertible register.

III. BRIEF DESCRIPTION OF THE DRAWINGS

These and other objects of the present invention, together with further features and advantages thereof, will become apparent from the following detailed specification when read together with the accompanying drawings, in which:

FIG. 4 illustrates a mode table and task tables.

IV. DETAILED DESCRIPTION OF THE DRAWINGS

Figure 1:
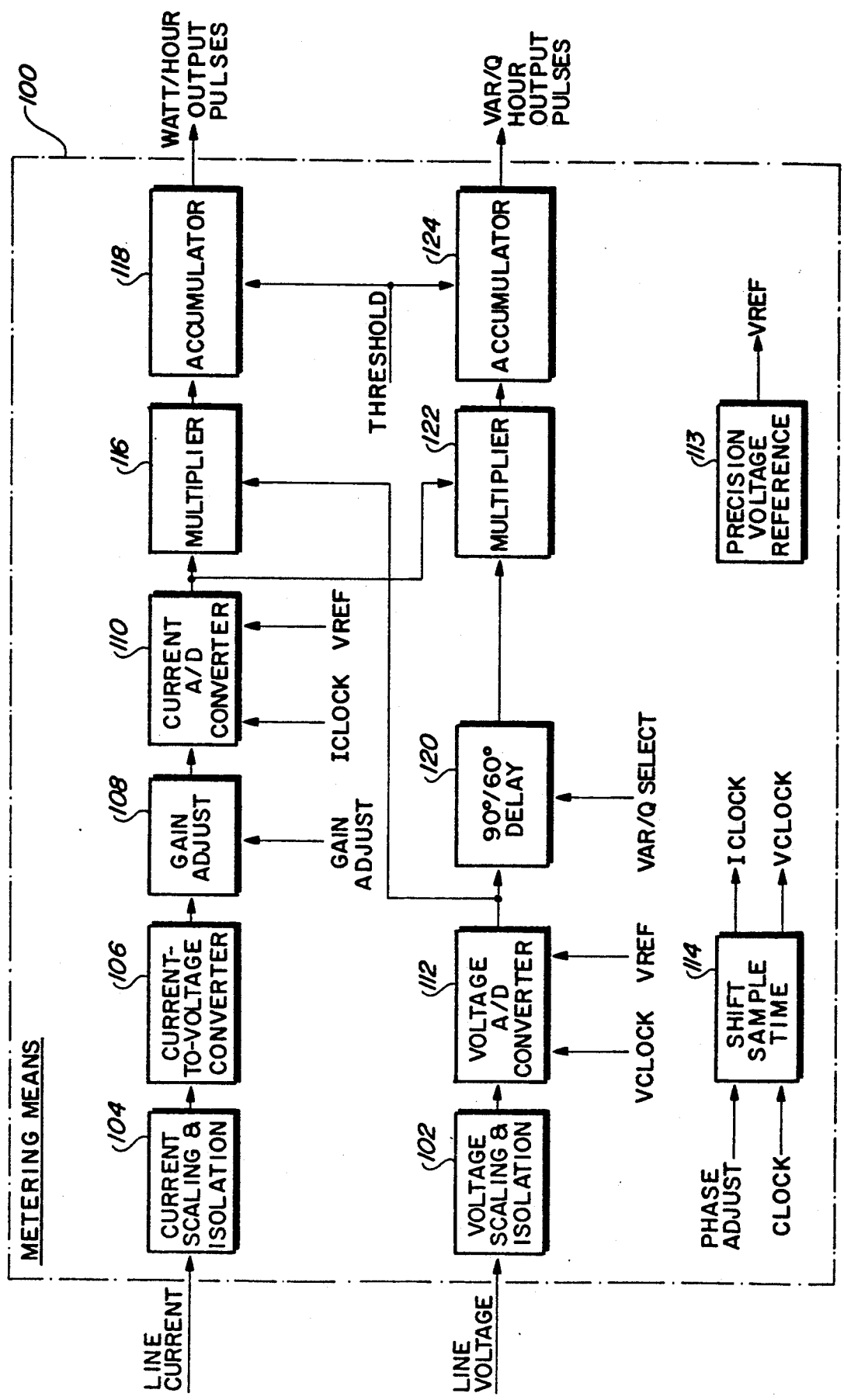
FIG. 1 is a block diagram description of one embodiment of metering means which may be utilized with the present invention.

FIG. 1 is a block diagram description of one embodiment of metering means 100 which may be utilized with the present invention. Particularly, line current inputs and line voltage inputs are provided to the metering means 100 and watthour output pulses and VAR/Q hour output pulses are output by the metering means 100, and the watthour output pulses and VAR/Q hour output pulses are provided to the register component 150 hereinafter described with reference to FIG. 2. The watthour output pulses and the VAR/Q hour pulses, respectively, are proportional to real and reactive energy consumption, respectively.

The line voltage and the line current inputs are electrically isolated and precisely scaled by respective scaling and isolation means 102 and 104 to provide secondary signals compatible with electronic circuitry. Voltage scaling to provide 1.6 Vrms at rated input voltage (120 V, for example) is suitable. Current scaling ratios of 100,000-to-one and 10,000-to-one, respectively, may be selected for self-contained (Full-scale 200 amperes) and transformer-rated (Full-scale 20 amperes) meters, respectively. Full scale secondary current from the current sensor is then 2.0 milliamps rms. A precision current-to-voltage converter 106 in the current input path converts a current signal into a voltage for compatibility with an A/D (analog-to-digital) converter. The scaling of the current-to-voltage converter is one volt output per milliamp input (1,000 ohms).

Adjustments for gain are provided by adjusting a gain stage 108 in the current path. A first A/D converter 110 is provided for the current signal and a second A/D converter 112 is provided for the voltage signal. Both A/D converters have a full-scale range of approximately ±3.45 volts dc, as determined by VREF from a precision voltage reference 113. The precision time base (CLOCK) 114 establishes a constant sample rate at which the A/D converters simultaneously "sample" the current and voltage inputs and convert their amplitudes to binary words. Sample rates in excess of several kilohertz are required to obtain good performance for harmonics in the input signals. Phase adjustment, to precisely match the phase of the current and voltage input signals, is provided by shifting the sample time of the voltage converter relative to the current converter in small discrete steps.

To obtain output pulses proportional to watthours, each binary-coded current sample is multiplied at a multiplier 116 by its corresponding voltage sample and the product is added to an accumulator 118. Each time the accumulated sum reaches a threshold value, proportional to the meter watthour constant, an output pulse is generated. The output pulse rate has been selected to be twelve times the rate of one disk revolution for an equivalent electromechanical meter to maintain compatibility with past generations of metering devices.

Output pulses proportional to varhours or Qhours are obtained in the same fashion as watthours except the voltage samples used are delayed, by a delay unit 120, a time equivalent to 90 degrees for varhours or 60 degrees for Qhours, either of which can be selected. Each binary coded current sample is multiplied at a multiplier 122 by the corresponding voltage sample and a separate accumulator 124 is used for varhour or Qhour accumulations. The same threshold as the watthour accumulator threshold is used as the varhour or Qhour thresholds. A typical threshold value is $144(10^{-6})$ volt-ampere-seconds (for a self-contained one-element meter for two-wire-single-phase applications).

For multiple phase loads, a multiplexer (not shown) can be used to extend the meter function. Separate isolation and scaling should be provided for each current and voltage input, but the remaining elements can be "time-shared".

Accuracy is primarily limited by noise, A/D converter resolution, linearity of input scaling, linearity of the current-to-voltage converter, and linearity of the A/D converters. Stability of performance with time and temperature is limited by the stability of input scaling, stability of the current-to-voltage converter resistor, and stability of the time base and voltage reference. An apparent inaccuracy can appear at high output pulse rates combined with a few output pulses per measurement. This occurs because of the cyclic nature of power flow at twice the line frequency causing "jitter" on the output pulse rate. This can be overcome by increasing the number of output pulses per measurement.

Figure 2:
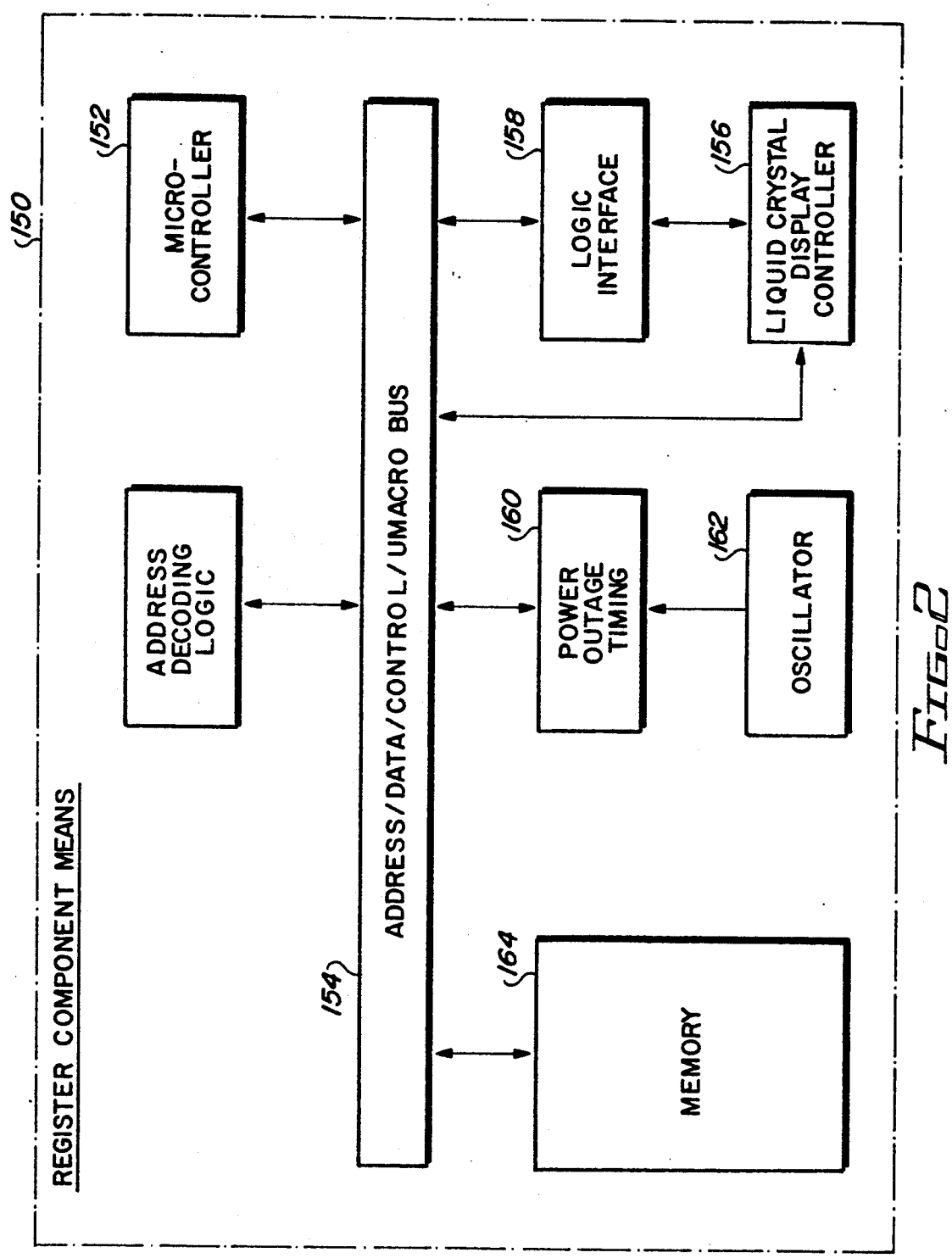
FIG. 2 is a block diagram description of one embodiment of register means.

FIG. 2 is a block diagram description of the register component means 150. The block diagram functions can be provided, for example, on a 1.2 micron CMOS application specific integrated circuit (ASIC) as is well known in the art.

The ASIC includes a microcontroller 152 coupled to an address, data, control, and umacro bus 154 (hereinafter referred to as the "bus"). A liquid crystal display controller 156 is coupled directly to the bus 154 and indirectly coupled to the bus 154 through a logic interface 158. A power outage timer 160, coupled to an oscillator 162, is coupled to the bus 154. A memory 164 including, for example, a ROM, EEPROM, and SRAM type memory blocks, also is coupled to the bus 154. The ASIC 150 also includes (but not shown) address decoding logic to define ASIC memory map, bank switching logic to extend processor address space, and communication gating logic to route register data for programming and retrieval purposes.

In operation, the microcontroller 152 performs calculating and ASIC control functions. The liquid crystal display controller 156 is utilized to control input/output means such as a liquid crystal display. The power outage timer 160, coupled to the oscillator 162, is used for timekeeping in the event of a power outage. Metering data, programs, and other information are stored in the memory 164. Further details with regard to measuring energy consumption are provided in commonly assigned, co-pending, U.S. patent application Ser. No. 07/691,252, filed Apr. 25, 1991, entitled "Method For Determining Electrical Energy Consumption", which is incorporated, in its entirety, herein by reference.

Figure 3:
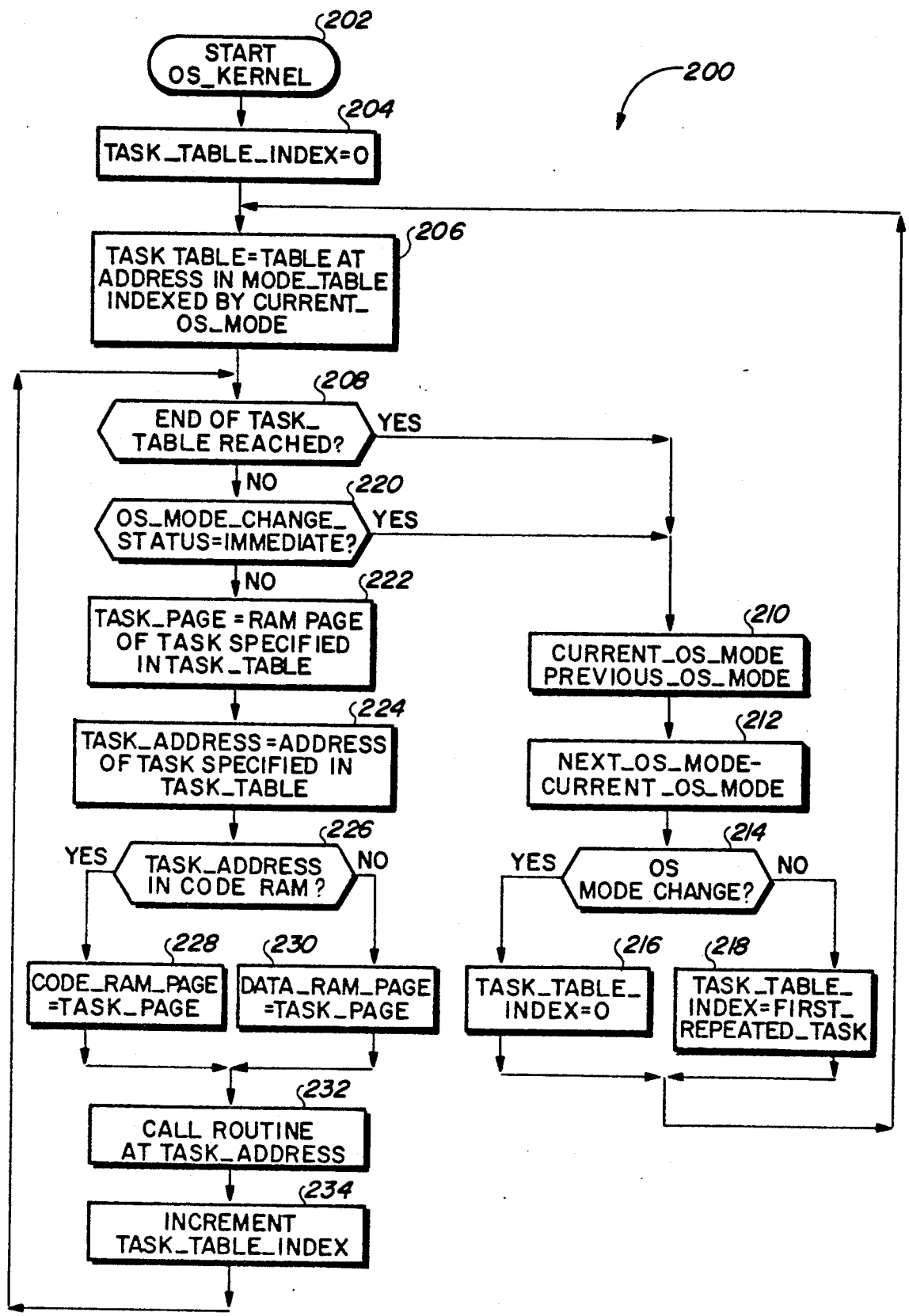
FIG. 3 is a flow chart illustrating one embodiment of a sequence of process steps in accordance with the present invention.

FIG. 3 is a flow chart 200 illustrating one embodiment of a sequence of process steps in accordance with the present invention. The process steps are executed by the microcontroller 152 operating under the control of an algorithm stored in the memory 164. More particularly, one aspect of the present invention is referred to as an operating system kernel (os_kernel). The operating system controls operations of the register component hardware configuration hereinbefore described with reference to FIG. 2 and the term "kernel" refers to the portion of the program which controls sequencing through respective task tables. The flow chart 200 illustrates the algorithm for executing respective task tables.

More particularly, once the os_kernel is initiated as indicated at a start block 202, the next step 204 is set the task_table_index to equal zero. Then, as indicated at a step 206, the next operation is to set the task_table equal to the table at the address identified in the mode_table indexed by the current_os_mode. More particularly, the mode byte is read to index an entry in the mode table. Each of the entries in the mode table is a pointer to a task table. For example, referring to FIG. 4, examples of mode and task tables used by the operating system as illustrated in flow chart form in FIG. 3 are set forth. In the mode table 300, the first entry is a pointer to task table 302. A subsequent entry is a pointer to task table 304. Each entry in the task table is a pointer to a main subroutine of a high-level task.

For the first iteration, the os_kernel then executes the first task of the task table. It is then determined whether the end of the task_table has been reached as indicated at a step 208. This means that it is determined whether the last task to be executed in a task table has been executed. If the last task has been executed, then operations proceed to step 210 wherein the previous_os_mode is set to the current_os_mode and the current_os_mode is set to the next_os_mode as indicated at step 212. This means that, at least with regard to steps 210 and 212, the mode of operation has not been changed and the same task tables are to be executed.

Then, at step 214, it is determined whether a mode change has been made. If a mode change has been made, then the task_table_index is set to equal zero so that the initial task in the task table to be executed is executed first. However, if no mode change has occurred, then the task_table_index is set to equal the FIRST_REPEATED_TASK. This means that if a task table is to be newly executed for the first time, then the mode initialization task (index=0) is to be executed (step 216). If, however, the mode has not changed and the task table is to be re-executed, the mode initialization task is not to be re-executed (step 218). That is, mode initialization tasks are to be performed only once per mode rather than once per task table cycle during the mode. Once the task table index is set to the appropriate setting, operations return to step 206.

If the end of the task_table has not been reached, as indicated at the step 208, then operations proceed to step 220. At step 220, it is determined whether an immediate mode change has been requested. If an immediate mode change has been requested, then operations proceed to step 210 and the operations hereinbefore described are executed.

If, however, no immediate mode change has been requested, then the task_page is set to equal the RAM page of the task specified in the task_table, i.e., the next task is selected for execution. The task_address is set to equal the address of the task specified in the task_table as indicated at a step 224.

If the task_address designated is in the code downloaded into RAM as indicated at step 226, then operations proceed to step 228 where the code_ram_page is set to equal the task_page. If the task address is not in the code downloaded into RAM, however, then the data_ram_page is set to equal the task_page as indicated at step 230.

The next step 232 is to then call the routine at the task_address and to execute the next task. The task_table_index is then incremented. Operations then return to step 208.

The present invention resides in the present algorithm for an operating system kernel for use in an electricity meter. The particular modes of operations and tasks may be defined by a system operator in a manner consistent with how the meter is to be used. For example, a variety of modes such as time-of-use mode, demand only mode, fail safe mode, catch-up (after a failure) mode, and communications mode can be implemented.

As hereinbefore described, when a mode is selected, task tables may be downloaded from the ROM or EEPROM into the RAM memory block. Execution of the task tables may be performed from the RAM memory block only or from some combination of respective memory blocks. When a mode change occurs, different task tables are to be executed and may be downloaded into the RAM to replace the task tables from the previously selected mode. The operating system kernel hereinbefore described, however, does not change when a different mode is selected.

Appendix A is a listing of pseudo code for execution of an embodiment of the operating system kernel. Appendix B is a listing of the demand only mode table. Appendix C is a listing of demand only task tables. Appendix D is a listing of the time-of-use and demand mode table, and Appendix E is a listing of the task tables for time-of-use operation. These pseudo code listings are provided to further exemplify one embodiment of a task table driven operating system for an electricity meter.

While the present invention has been described with respect to specific embodiments, many modifications, variations, substitutions, and equivalents will be apparent to those skilled in the art. Accordingly, the invention is to be considered as limited only by the spirit and scope of the appended claims.

APPENDIX A

COPYRIGHT (C) 1990 GENERAL ELECTRIC COMPANY

```
task_table_index = INITIALIZATION_TASK
REPEAT
    WHILE (task_address <> SENTINEL_VALUE)
    AND (os_mode_change_status <> IMMEDIATE)
        task_page = page specified in task_table_buffer
        [task_table_index]
        task_address = address specified in task_table_buffer
        [task_table_index]
        IF task_address >= DATA_RAM_START
            perform change_data_ram_page(task_page)
        ELSE
            perform change_code_ram_page(task_page)
        ENDIF
        perform call to task_address
        increment task_table_index
    ENDWHILE
    previous_os_mode = current_os_mode
    current_os_mode = next_os_mode
    IF current_os_mode = previous_os_mode
```

APPENDIX A-continued
COPYRIGHT (C) 1990 GENERAL ELECTRIC COMPANY

```
        task_table_index = FIRST_REPEATED_TASK
    ELSE
        task_table_index = INITIALIZATION_TASK
    perform update_os_mode()
    ENDIF
FOREVER
```

APPENDIX B
COPYRIGHT (C) 1990 GENERAL ELECTRIC COMPANY

```
rom_mode_table:
    DB      PAGE_1
    DW      rom_initialization_task_table
    DB      PAGE_1
    DW      rom_demand_only_task_table
    DB      PAGE_1
    DW      rom_demand_only_power_fail_task_table
    DB      PAGE_1
    DW      rom_demand_only_test_mode_task_table
    DB      PAGE_1
    DW      rom_optocom_mode_task_table
    DB      PAGE_1
    DW      rom_std_protocol_mode_task_table
    DB      PAGE_1
    DW      rom_fail_safe_mode_task_table
    DB      PAGE_1
    DW      rom_fail_safe_test_mode_task_table
    DB      PAGE_1
    DW      rom_fail_safe_initialization_mode_task_table
    DB      PAGE_1
    DW      rom_manufacturing_test_mode_task_table
```

APPENDIX C
COPYRIGHT (C) 1990 GENERAL ELECTRIC COMPANY

```
rom_task_tables:
rom_initialization_task_table:
    DB      PAGE_0
    DW      initialization_mode_init
    DB      PAGE_0
    DW      communication_task_initialization
    DB      PAGE_0
    DW      init_parameter_program
    DB      PAGE_0
    DW      init_totals_task
    DB      PAGE_0
    DW      time_date_initialization
    DB      PAGE_0
    DW      demand_calc_initialization
    DB      PAGE_0
    DW      init_external_control_task
    DB      PAGE_0
    DW      init_check_thresholds_task
    DB      PAGE_0
    DW      init_reset_switch_control_task
    DB      PAGE_0
    DW      display_task_init
    DB      PAGE_0
    DW      init_test_task
    DB      PAGE_0
    DW      self_test_high_level_init
    DB      PAGE_0
    DW      high_level_initialization
    DB      00H
    DW      SENTINEL_VALUE
rom_demand_only_task_table:
    DB      PAGE_0
    DW      demand_only_mode_init
    DB      PAGE_0
    DW      allow_power_fail_interrupt
    DB      PAGE_0
    DW      communication_monitor
    DB      PAGE_0
    DW      prevent_power_fail_interrupt
    DB      PAGE_0
    DW      totals_task
    DB      PAGE_0
    DW      demand_only_time_date_task_support
```

APPENDIX C-continued
COPYRIGHT (C) 1990 GENERAL ELECTRIC COMPANY

```
    DB      PAGE_0
    DW      demand_only_demand_calculation
    DB      PAGE_0
    DW      allow_power_fail_interrupt
    DB      PAGE_0
    DW      prevent_power_fail_interrupt
    DB      PAGE_0
    DW      external_control_task
    DB      PAGE_0
    DW      check_thresholds_task
    DB      PAGE_0
    DW      reset_switch_control_task
    DB      PAGE_0
    DW      allow_power_fail_interrupt
    DB      PAGE_0
    DW      display_task
    DB      PAGE_0
    DW      inactive_test_mode
    DB      PAGE_0
    DW      param_pgm_task
    DB      PAGE_0
    DW      prevent_power_fail_interrupt
    DB      PAGE_0
    DW      self_test_task
    DB      PAGE_0
    DW      allow_power_fail_interrupt
    DB      00H
    DW      SENTINEL_VALUE
rom_demand_only_power_fail_task_table:
    DB      PAGE_0
    DW      demand_only_power_fail_mode_init
    DB      PAGE_0
    DW      demand_only_power_fail_totals
    DB      PAGE_0
    DW      demand_only_time_date_task_support
    DB      PAGE_0
    DW      demand_only_demand_calculation
    DB      00H
    DW      SENTINEL_VALUE
rom_demand_only_test_mode_task_table:
    DB      PAGE_0
    DW      test_mode_initialization_task
    DB      PAGE_0
    DW      prevent_power_fail_interrupt
    DB      PAGE_0
    DW      totals_test_support
    DB      PAGE_0
    DW      demand_only_time_date_task_support
    DB      PAGE_0
    DW      allow_power_fail_interrupt
    DB      PAGE_0
    DW      test_mode_demand_calculation
    DB      PAGE_0
    DW      external_control_task
    DB      PAGE_0
    DW      check_thresholds_task
    DB      PAGE_0
    DW      reset_switch_control_task
    DB      PAGE_0
    DW      display_task
    DB      PAGE_0
    DW      param_pgm_task
    DB      PAGE_0
    DW      active_test_mode
    DB      00H
    DW      SENTINEL_VALUE
rom_optocom_mode_task_table:
    DB      PAGE_0
    DW      optocom_mode_init
    DB      PAGE_0
    DW      optocom_message_handler
    DB      PAGE_0
    DW      param_pgm_optocom
    DB      00H
    DW      SENTINEL_VALUE
rom_std_protocol_mode_task_table:
    DB      PAGE_0
    DW      std_protocol_mode_init
    DB      PAGE_0
    DW      std_protocol_task
    DB      PAGE_0
```

APPENDIX C-continued

COPYRIGHT (C) 1990 GENERAL ELECTRIC COMPANY

```
        DW      param_pgm_optocom
        DB      00H
        DW      SENTINEL_VALUE
rom_fail_safe_mode_task_table:
        DB      PAGE_0
        DW      fail_safe_mode_init
        DB      PAGE_0
        DW      allow_power_fail_interrupt
        DB      PAGE_0
        DW      communication_monitor
        DB      PAGE_0
        DW      prevent_power_fail_interrupt
        DB      PAGE_0
        DW      fail_safe_totals
        DB      PAGE_0
        DW      allow_power_fail_interrupt
        DB      PAGE_0
        DW      display_task
        DB      PAGE_0
        DW      inactive_test_mode
        DB      PAGE_0
        DW      param_pgm_task
        DB      PAGE_0
        DW      prevent_power_fail_interrupt
        DB      PAGE_0
        DW      self_test_task
        DB      PAGE_0
        DW      allow_power_fail_interrupt
        DB      00H
        DW      SENTINEL_VALUE
rom_fail_safe_test_mode_task_table:
        DB      PAGE_0
        DW      test_mode_initialization_task
        DB      PAGE_0
        DW      allow_power_fail_interrupt
        DB      PAGE_0
        DW      totals_test_support
        DB      PAGE_0
        DW      test_mode_demand_calculation
        DB      PAGE_0
        DW      check_thresholds_task
        DB      PAGE_0
        DW      reset_switch_control_task
        DB      PAGE_0
        DW      display_task
        DB      PAGE_0
        DW      param_pgm_task
        DB      PAGE_0
        DW      active_test_mode
        DB      00H
        DW      SENTINEL_VALUE
rom_fail_safe_initialization_mode_task_table:
        DB      PAGE_0
        DW      fail_safe_initialization_mode_init
        DB      PAGE_0
        DW      communication_task_initialization
        DB      PAGE_0
        DW      init_parameter_program
        DB      PAGE_0
        DW      init_totals_task
        DB      PAGE_0
        DW      time_date_initialization
        DB      PAGE_0
        DW      demand_calc_initialization
        DB      PAGE_0
        DW      init_check_thresholds_task
        DB      PAGE_0
        DW      init_reset_switch_control_task
        DB      PAGE_0
        DW      display_task_init
        DB      PAGE_0
        DW      init_test_task
        DB      PAGE_0
        DW      self_test_fail_safe_init
        DB      PAGE_0
        DW      high_level_initialization
        DB      00H
        DW      SENTINEL_VALUE
rom_manufacturing_test_mode_task_table:
        DB      PAGE_0
        DW      manufacturing_test_mode_init
```

APPENDIX C-continued

COPYRIGHT (C) 1990 GENERAL ELECTRIC COMPANY

```
        DB      PAGE_0
        DW      manufacturing_test_task
        DB      00H
        DW      SENTINEL_VALUE
```

APPENDIX D

COPYRIGHT (C) 1990 GENERAL ELECTRIC COMPANY

```
ram_mode_table:
        DB      PAGE_1
        DW      tou_demand_initialization_task_table
        DB      PAGE_0
        DW      rom_demand_only_task_table
        DB      PAGE_0
        DW      rom_demand_only_power_fail_task_table
        DB      PAGE_0
        DW      rom_demand_only_test_mode_task_table
        DB      PAGE_0
        DW      rom_optocom_mode_task_table
        DB      PAGE_0
        DW      rom_std_protocol_mode_task_table
        DB      PAGE_0
        DW      rom_fail_safe_mode_task_table
        DB      PAGE_0
        DW      rom_fail_safe_test_mode_task_table
        DB      PAGE_0
        DW      rom_fail_safe_initialization_mode_task_table
        DB      PAGE_0
        DW      rom_manufacturing_test_mode_task_table
        DB      PAGE_1
        DW      tou_demand_task_table
        DB      PAGE_1
        DW      catch_up_mode_task_table
        DB      PAGE_1
        DW      tou_demand_test_mode_task_table
        DB      PAGE_0
        DW      0000H   ;extra entry
        DB      PAGE_0
        DW      0000H   ;extra entry
```

APPENDIX E

COPYRIGHT (C) 1990 GENERAL ELECTRIC COMPANY

```
ram_task_tables:
tou_demand_initialization_task_table:
        DB      PAGE_0
        DW      initialization_mode_init
        DB      PAGE_0
        DW      high_level_initialization
        DB      PAGE_0
        DW      communication_task_initialization
        DB      PAGE_0
        DW      init_parameter_program
        DB      PAGE_0
        DW      init_totals_task
        DB      PAGE_0
        DW      time_data_initialization
        DB      PAGE_2
        DW      init_prog_dates_task
        DB      PAGE_0
        DW      demand_calc_initialization
        DB      PAGE_2
        DW      init_season_change_task
        DB      PAGE_0
        DW      init_external_control_task
        DB      PAGE_2
        DW      init_rate_change_task
        DB      PAGE_2
        DW      init_load_profile_task
        DB      PAGE_0
        DW      init_check_thresholds_task
        DB      PAGE_0
        DW      init_reset_switch_control_task
        DB      PAGE_0
        DW      display_task_init
        DB      PAGE_0
        DW      init_test_task
        DB      PAGE_0
```

APPENDIX E-continued
COPYRIGHT (C) 1990 GENERAL ELECTRIC COMPANY

```
        DW      self_test_high_level_init
        DB      00H
        DW      SENTINEL_VALUE
tou_demand_task_table:
        DB      PAGE_2
        DW      tou_demand_mode_init
        DB      PAGE_0
        DW      abort_after_power_fail
        DB      PAGE_0
        DW      communication_monitor
        DB      PAGE_0
        DW      continue_after_power_fail
        DB      PAGE_0
        DW      prevent_power_fail_interrupt
        DB      PAGE_0
        DW      totals_task
        DB      PAGe_0
        DW      allow_power_fail_interrupt
        DB      PAGE_2
        DW      tou_demand_time_date_task_support
        DB      PAGE_2
        DW      programmable_dates_task
        DB      PAGE_2
        DW      tou_demand_demand_calculation
        DB      PAGE_2
        DW      season_change_task
        DB      PAGE_2
        DW      rate_change_task
        DB      PAGE_2
        DW      load_profile_recording_task
        DB      PAGE_0
        DW      exgternal_control_task
        DB      PAGE_0
        DW      check_thresholds_task
        DB      PAGE_0
        DW      reset_switch_control_task
        DB      PAGE_0
        DW      abort_after_power_fail
        DB      PAGE_0
        DW      display_task
        DB      PAGE_0
        DW      inactive_test_mode
        DB      PAGE_0
        DW      param_pgm_task
        DB      PAGE_0
        DW      continue_after_power_fail
        DB      PAGE_0
        DW      prevent_power_fail_interrupt
        DB      PAGE_0
        DW      self_test_task
        DB      PAGE_0
        DW      allow_power_fail_interrupt
        DB      00H
        DW      SENTINEL_VALUE
catch_up_mode_task_table:
        DB      PAGE_2
        DW      catch_up_mode_init
        DB      PAGE_2
        DW      prevent_power_fail_interrupt
        DB      PAGE_2
        DW      totals_catch_up_support
        DB      PAGE_0
        DW      allow_power_fail_interrupt
        DB      PAGE_2
        DW      tou_demand_time_date_task_support
        DB      PAGE_2
        DW      programmable_dates_task
        DB      PAGE_2
        DW      fast_catch_up_task
        DB      PAGE_2
        DW      tou_demand_demand_calculation
        DB      PAGE_2
        DW      season_change_task
        DB      PAGE_2
        DW      rate_change_task
        DB      PAGE_2
        DW      load_profile_recording_task
        DB      00H
        DW      SENTINEL_VALUE
tou_demand_test_mode_task_table:
        DB      PAGE_0
        DW      test_mode_initialization_task
        DB      PAGE_0
        DW      prevent_power_fail_interrupt
        DB      PAGE_0
        DW      totals_test_support
        DB      PAGE_2
        DW      tou_demand_time_date_task_support
        DB      PAGE_2
        DW      programmable_dates_task
        DB      PAGE_0
        DW      test_mode_demand_calculation
        DB      PAGE_2
        DW      season_change_task
        DB      PAGE_2
        DW      rate_change_task
        DB      PAGE_2
        DW      load_profile_recording_task
        DB      PAGE_0
        DW      external_control_task
        DB      PAGE_0
        DW      check_thersholds_task
        DB      PAGE_0
        DW      reset_switch_control_task
        DB      PAGE_0
        DW      allow_power_fail_interrupt
        DB      PAGE_0
        DW      display_task
        DB      PAGE_0
        DW      param_pgm_task
        DB      PAGE_0
        DW      active_test_mode
        DB      00H
        DW      SENTINEL_VALUE
```

What is claimed is:

1. A programmable solid-state electronic register component for an electrical energy meter, comprising:
   a mode table;
   a plurality of task tables;
   a plurality of modules;
      wherein said mode table comprises an array of task pointers to respective ones of said plurality of task tables,
      wherein each of said plurality of task tables comprises an array of module pointers to corresponding ones of said plurality of modules,
      wherein each of said plurality of modules comprises a plurality of instructions to be executed during the performance of a corresponding task, which is included in at least one of predetermined groups of tasks, and
      wherein each of said predetermined groups of tasks is defined by one of said task tables and corresponds to a predetermined mode of operation such as a time-of-use and demand mode of operation or a demand-only mode of operation; and
   micro-controller means for operating said register component in said predetermined mode of operation by executing a corresponding predetermined group of tasks, said micro-controller means comprising
      means for indexing to a task pointer in said mode table to thereby select one of said predetermined groups of tasks, said task pointer corresponding to a selected task table,
      means for executing said one of said predetermined groups of tasks by repeatedly indexing said selected task table to respective module pointers, and
      means for executing said plurality of modules corresponding to said respective module pointers.

2. The programmable solid-state electronic register component of claim 1, wherein said mode table, said plurality of task tables and said plurality of modules are contained in memory comprising read-only memory and random-access memory and wherein said means for executing said one of said predetermined groups of tasks comprises means for executing said one of said predetermined groups of tasks in said random-access memory.

3. The programmable solid-state electronic register component of claim 2, further comprising input/output means responsive to actuation by a user for selecting said programmed mode of operation and means for downloading said task tables corresponding to said programmed mode of operation to said random-access memory.

4. The programmable solid-state electronic register component of claim 3, wherein said means for downloading said task tables comprises means for downloading said task tables corresponding to said programmed mode of operation from said read-only memory to said random-access memory.

5. The programmable solid-state electronic register component of claim 4, wherein said input/output means comprises a liquid crystal display.

6. The programmable solid-state electronic register component of claim 1, wherein said arrays of module pointers for each of said task tables include a mode-initialization pointer corresponding to a respective mode-initialization module and wherein said means for executing said plurality of modules comprises means for executing said respective mode-initialization module only once during said programmed mode of operation.

7. The programmable solid-state electronic register component of claim 3, wherein said arrays of module pointers for each of said task tables include a mode-initialization pointer corresponding to a respective mode-initialization module and wherein said means for executing said plurality of modules comprises means for executing said respective mode-initialization module only once during said programmed mode of operation.

8. The programmable solid-state electronic register component of claim 7, further comprising:
   means for halting said means for executing said one of said predetermined groups of tasks prior to indexing the entire selected task table; and
   means for initializing said means for downloading said task tables corresponding to another programmed mode of operation from said read-only memory to said random-access memory.

9. The programmable solid-state electronic register component of claim 2, wherein said memory and said microcontroller means are contained in an application specific integrated circuit.

* * * * *